US011195567B2

(12) United States Patent
Tsai et al.

(10) Patent No.: US 11,195,567 B2
(45) Date of Patent: Dec. 7, 2021

(54) BALANCED NEGATIVE BITLINE VOLTAGE FOR A WRITE ASSIST CIRCUIT

(71) Applicant: Taiwan Semiconductor Manufacturing Company, Ltd., Hsinchu (TW)

(72) Inventors: Jui-Che Tsai, Tainan (TW); Chia-En Huang, Xinfeng Township (TW); Chia-Cheng Chen, Toufen Township (TW); Yih Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 21 days.

(21) Appl. No.: 16/731,357

(22) Filed: Dec. 31, 2019

(65) Prior Publication Data

US 2021/0201977 A1 Jul. 1, 2021

(51) Int. Cl.
*G11C 11/24* (2006.01)
*G11C 7/12* (2006.01)
*G11C 11/419* (2006.01)

(52) U.S. Cl.
CPC ............ *G11C 11/24* (2013.01); *G11C 7/12* (2013.01); *G11C 11/419* (2013.01)

(58) Field of Classification Search
CPC ......... G11C 7/12; G11C 11/24; G11C 11/419; G11C 11/417; G11C 11/4085
USPC ................. 365/149, 154, 189.01, 189.08
See application file for complete search history.

(56) References Cited

U.S. PATENT DOCUMENTS

| 9,349,438 | B2* | 5/2016 | Sano | G11C 11/419 |
| 2015/0076575 | A1* | 3/2015 | Wu | G11C 11/419 |
| | | | | 257/296 |
| 2015/0131364 | A1 | 5/2015 | Hsieh et al. | |
| 2015/0206576 | A1 | 7/2015 | Gong et al. | |
| 2018/0003692 | A1 | 1/2018 | Jung et al. | |

(Continued)

FOREIGN PATENT DOCUMENTS

| KR | 0170906 B1 | 3/1999 |
| KR | 10-2018-0003217 A | 1/2018 |

OTHER PUBLICATIONS

Chen et al., "A 16 nm 128 Mb SRAM in High-κ Metal-Gate FinFET Technology With Write-Assist Circuitry for Low-VMIN Applications." IEEE Journal of Solid-State Circuits, vol. 50, No. 1, pp. 170-177, Jan. 2015.

*Primary Examiner* — Connie C Yoha
(74) *Attorney, Agent, or Firm* — Merchant & Gould P.C.

(57) ABSTRACT

A circuit and method for establishing a balanced negative voltage to a near-end and far-end of a bitline having a plurality of memory cells connected to the bitline is disclosed. A MOS capacitor and a metal capacitor are connected in parallel. The MOS capacitor is connected to the near-end of the bitline through a first switch transistor. The metal capacitor is connected to the near-end of the bitline through the first switch transistor and the far end of the bitline through a second switch transistor. A falling negative boost voltage is applied to the MOS capacitor and the metal capacitor. When the switch transistors are turned on during a write operation, the MOS capacitor and the metal capacitor are both coupled to the voltage at the near-end and far-end and drive the voltage to approximately equal the boost voltage, thereby providing a balanced voltage to the bitline.

20 Claims, 9 Drawing Sheets

(56) References Cited

U.S. PATENT DOCUMENTS

2020/0135269 A1* 4/2020 Hsieh .................... G11C 11/419
2021/0098055 A1* 4/2021 Lim ...................... G11C 11/419

* cited by examiner

BALANCED NEGATIVE BITLINE VOLTAGE FOR A WRITE ASSIST CIRCUIT

BACKGROUND

A common type of integrated circuit memory is a static random access memory (SRAM) device. A typical SRAM memory device includes an array of memory cells, with each memory cell having six transistors connected between an upper reference potential and a lower reference potential. Each memory cell has two storage nodes where information may be stored. The first node stores the desired information, while the complementary information is stored at the second storage node. SRAM cells have the advantageous feature of holding data without requiring a refresh.

The lowest VDD voltage (positive power supply voltage) at which an SRAM bit cell may function is referred to as Vccmin. Having a low cell VDD near Vccmin reduces leakage current and also reduces the incidence of read flips. But having a high cell VDD improves the probability of successful write operations. Therefore, the Vccmin is limited by the write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A "boost signal" may be provided to the bitline of an SRAM memory array during write operations. This boost signal lowers the bitline below ground voltage, which assists in write operations. The boost signal is applied at a first end, referred to as the "near-end", of the bitline associated with a plurality of memory cells. The other end of the bitline for the plurality of memory cells is referred to as the "far-end". Due to resistance and array leakage currents between the near-end and far-end, the boost signal is not uniform or balanced between the ends. Further, over-boosting has been required at the near-end side of the bitline to achieve an effective negative voltage level at the far-end of the bitline.

Thus, a circuit and method that enables a more balanced negative bitline voltage ("NVSS") across the plurality of memory cells connected to the bitline is desired for optimizing write Vccmin performance while minimizing the impact on transistor reliability. This is advantageous for a number of circuit on chip devices, as well as other circuits, including for example SRAM memory arrays. Embodiments constructed in accordance with the principles of the present invention provide improved far-end write assist.

Figure 1:
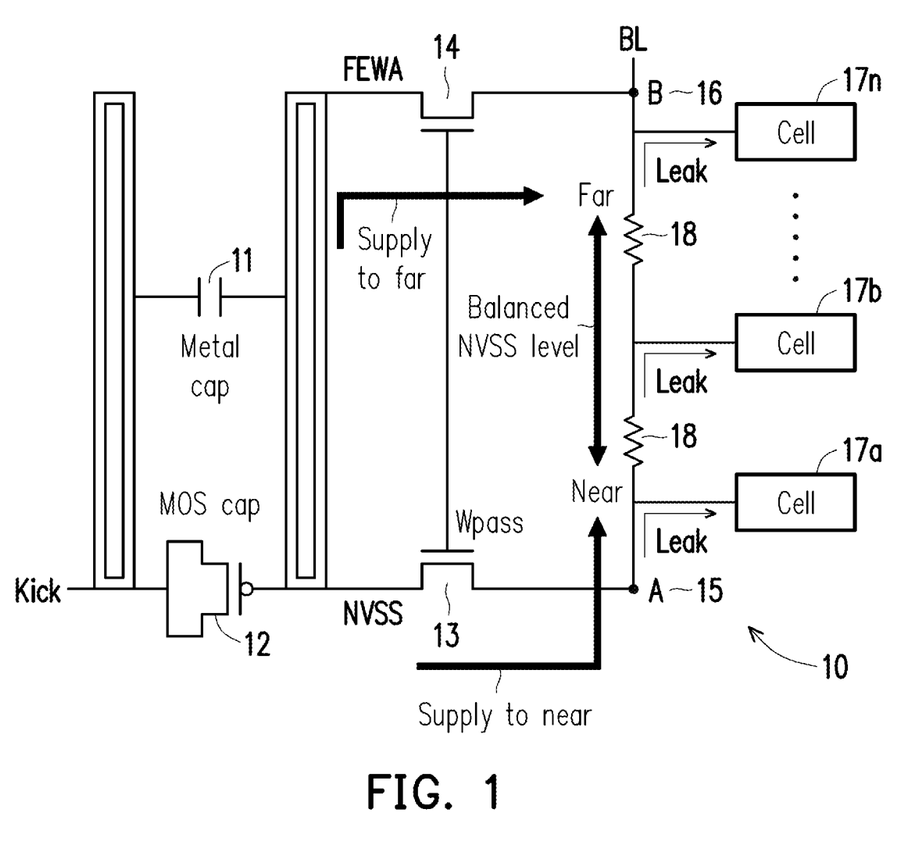
FIG. 1 is a schematic diagram illustrating aspects of an example balanced negative bitline voltage circuit in accordance with some embodiments.

Turning now to FIG. 1, a schematic diagram illustrating aspects of an example balanced negative bitline voltage circuit in accordance with some embodiments is illustrated. The circuit is shown generally at 10. A boost signal (also referred to as "Kick" herein) is provided to a metal capacitor 11 and a MOS capacitor 12. Since the two capacitors are in parallel, the respective capacitances are additive with one another. The second plate of the metal capacitor 11 is connected to the drain of a first NMOS transistor 13 and the drain of a second NMOS transistor 14. The source of the first NMOS transistor 13 is connected to Node A 15, which is situated at the near-end of the memory cell array 17a-17n. The source of the second NMOS transistor 14 is connected to Node B 16, which is situated at the far-end of the memory cell array 17a-17n. A Wpass signal is connected to the gates of NMOS transistor 13 and NMOS transistor 14. In some embodiments, the Wpass signal may be generated by a Y-address decode module.

In operation, the Kick signal begins at a voltage approximately equal to zero. When enabled, the Kick signal goes negative. In some embodiments the range is between 0~-300 mV, in other embodiments a range of approximately -100~-200 mV may be provided, and in still further embodiments a value of approximately -200 mV may be used. The Wpass signal goes high when the Y-address decode module selects the bitline and the first and second NMOS transistors 13, 14 turn on. The first and second NMOS transistors then are in a low resistance state which creates a coupling between the Kick voltage signal and NVSS via the metal capacitor 11 and the MOS capacitor 12. The capacitors operate by trying to maintain the voltage differential and so drive NVSS low. As will be appreciate by those of skill in the art, this low period occurs for an RC period based upon the individual capacitors and circuit resistance (described further below).

By tying the second plate of the metal capacitor 11 to both the near-end and far-end, the negative voltage is applied to both and creates a far-end-write-assist ("FEWA"). More specifically, the FEWA is created by providing a balanced NVSS boost signal across the array of memory cells. The balanced NVSS boost signal is established because the metal capacitor 11 is constructed of low resistance metal (i.e., there is essentially no voltage drop across the plate of the capacitor) and there is no array leakage in this path. Accordingly, there is very little voltage differential to unbalance the NVSS provided to both near-end and far-end. The resistance 18 and leakage associated with the array of cells 17a-17n is illustrated between the near-end Node A 15 and the far-end Node B 16 in FIG. 1.

In accordance with the above description, the balanced negative bitline circuit 10 supplies the same negative voltage to both the near-end at Node A 15 and the far-end at Node B 16. By driving the far-end to the negative voltage, the FEWA is created as described above. This provides a more balanced NVSS level across the plurality of memory cells 17a-17n on the respective bitline. An advantage of the balanced NVSS level is that over-boosting is not necessary. Further, by providing the FEWA, the negative bitline design may be employed even if the bitline resistance increases, for example due to process scaling. Thus, overall design and porting efforts may be reduced by utilizing the principles of the present invention.

Figure 2A:
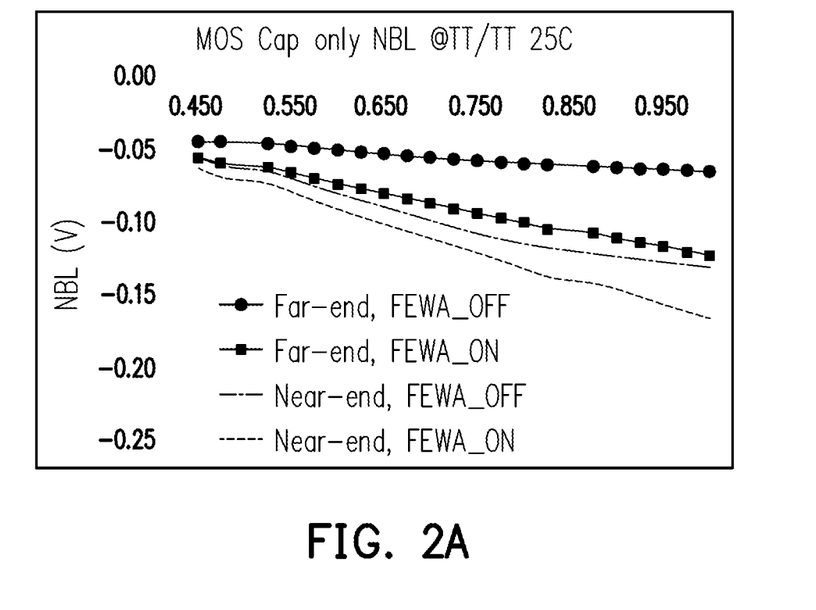
FIG. 2A is a graph illustrating the modeled results of using a MOS capacitor in a far-end-write-assist circuit for different operating voltages of an example SRAM circuit for some embodiments.

Referring to FIG. 2A, there is a graph illustrating the modeled results of only using a MOS Capacitor in a far-end write assist circuit for different operating voltages of an SRAM circuit. The graph illustrates that by using only a MOS capacitor the near-end results in a negative bitline voltage value are greater than the far-end values (as illustrated on the Y-axis). This result occurs regardless of the operating voltage of the SRAM memory array (as illustrated on the x-axis). However, the difference is more pronounced (e.g., Near>Far) as the operating voltage increases.

Figure 2B:
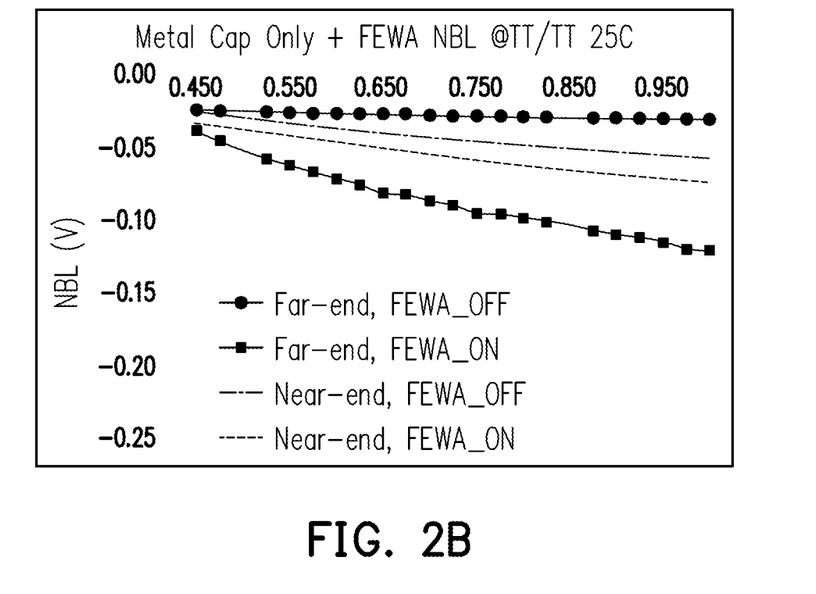
FIG. 2B is a graph illustrating the modeled results of using a metal capacitor in a far-end-write-assist circuit for different operating voltage levels of an example SRAM circuit for some embodiments.

FIG. 2B illustrates the modeled results of only using a metal capacitor in a far-end-write-assist circuit for different operating voltage levels of an SRAM circuit. In this case the far-end results are more negative than the near-end when the FEWA is on. Again, this result occurs regardless of the operating voltage of the SRAM memory array. However, the difference is greater (e.g., Far>Near) as the operating voltage increases.

Figure 2C:
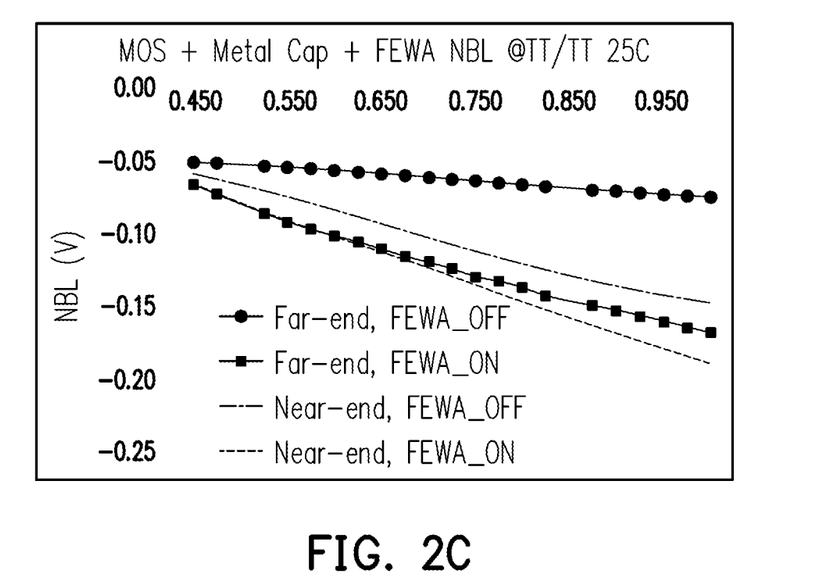
FIG. 2C is a graph illustrating the modeled results of using both a MOS capacitor and a metal capacitor in a far-end-write-assist-circuit for different operating voltage levels of an example SRAM circuit for some embodiments.

FIG. 2C illustrates the modeled results of using both a MOS capacitor and a metal capacitor in a far-end-write-assist circuit for different operating voltage levels of an SRAM circuit. Here the results demonstrate a large gap in negative voltages when the FEWA is off, but when the FEWA is turned on there is very little gap between the Far-end (FEWA_on) and the near-end (FEWA_on) results at lower operating voltages and a very small gap at higher operating voltages. This illustrates an advantage of balancing the near-end and far-end voltages.

The MOS capacitor 12 and metal capacitor 11 are capacitor types that are well suited for use in an SRAM environment. A MOS capacitor has a metal oxide semiconductor structure generally including a semiconductor substrate with a thin oxide layer, an insulator, and a top metal. The drain and source connections are the bottom plate of the capacitor and the top metal is the gate contact. A metal capacitor is typically metal plates stacked on one another and separated by a thin oxide layer. Metal capacitors may be constructed as either MIM (metal-insulator-metal) or MOM (metal-oxide-metal) types. However, both types are generally very accurate and linear (e.g., the capacitance is independent of voltage).

While MOS capacitors and metal capacitors are used in some embodiments, it will be appreciated that other types of capacitors may be used. Instead, it is the function of the capacitor in maintaining the voltage differential between the capacitor plates, which then drives the NVSS voltage to a negative level at both ends, that should be considered.

Figure 3:
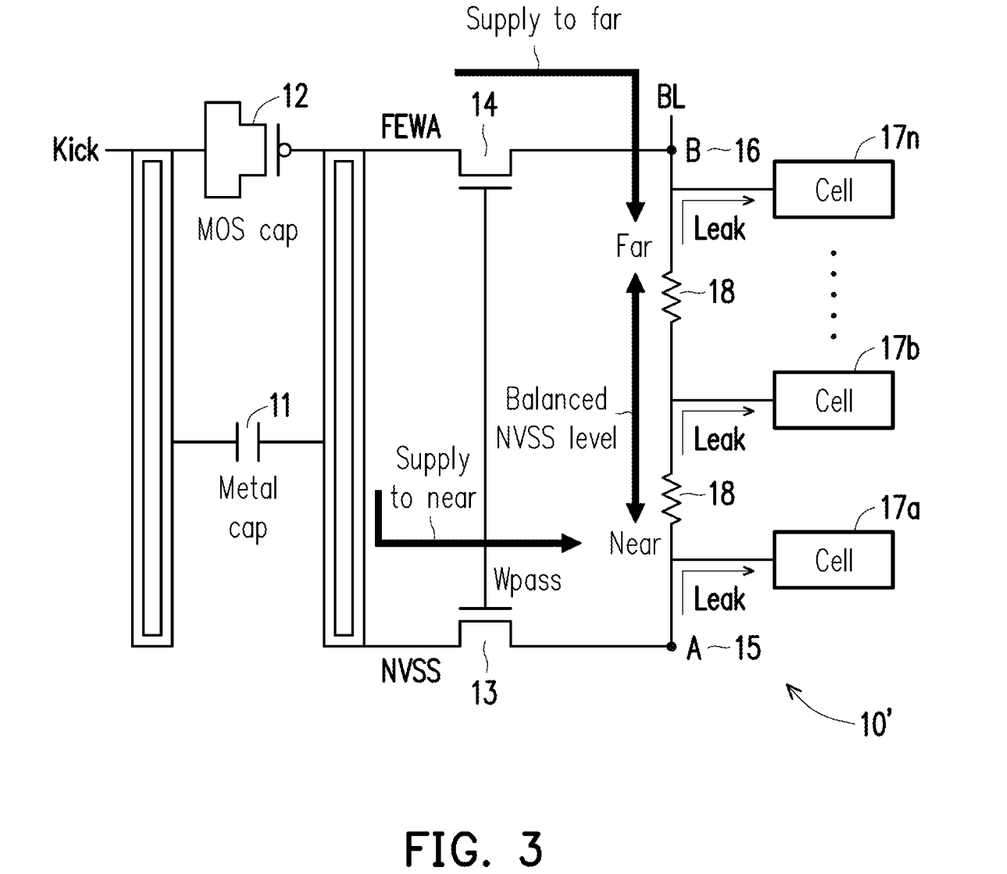
FIG. 3 is a schematic diagram illustrating aspects of a first alternative embodiment balanced negative bitline voltage circuit in accordance with some embodiments.

Referring to FIG. 3, a first alternative embodiment balanced negative bitline voltage circuit 10' is illustrated in accordance with some embodiments. In this embodiment, the MOS capacitor 12 is interchanged from the near-end to the far-end. The other elements remain in the locations and with the connections described above in connection with FIG. 1. It will be appreciated, however, that in this embodiment the metal capacitor 11 now provides the negative voltage to the near-end from the far-end. From this embodiment, it will be further appreciated that the location of the MOS capacitor 12 may be varied from the near-end to the far-end while still providing a more balanced NVSS level for the bitline.

Figure 4:
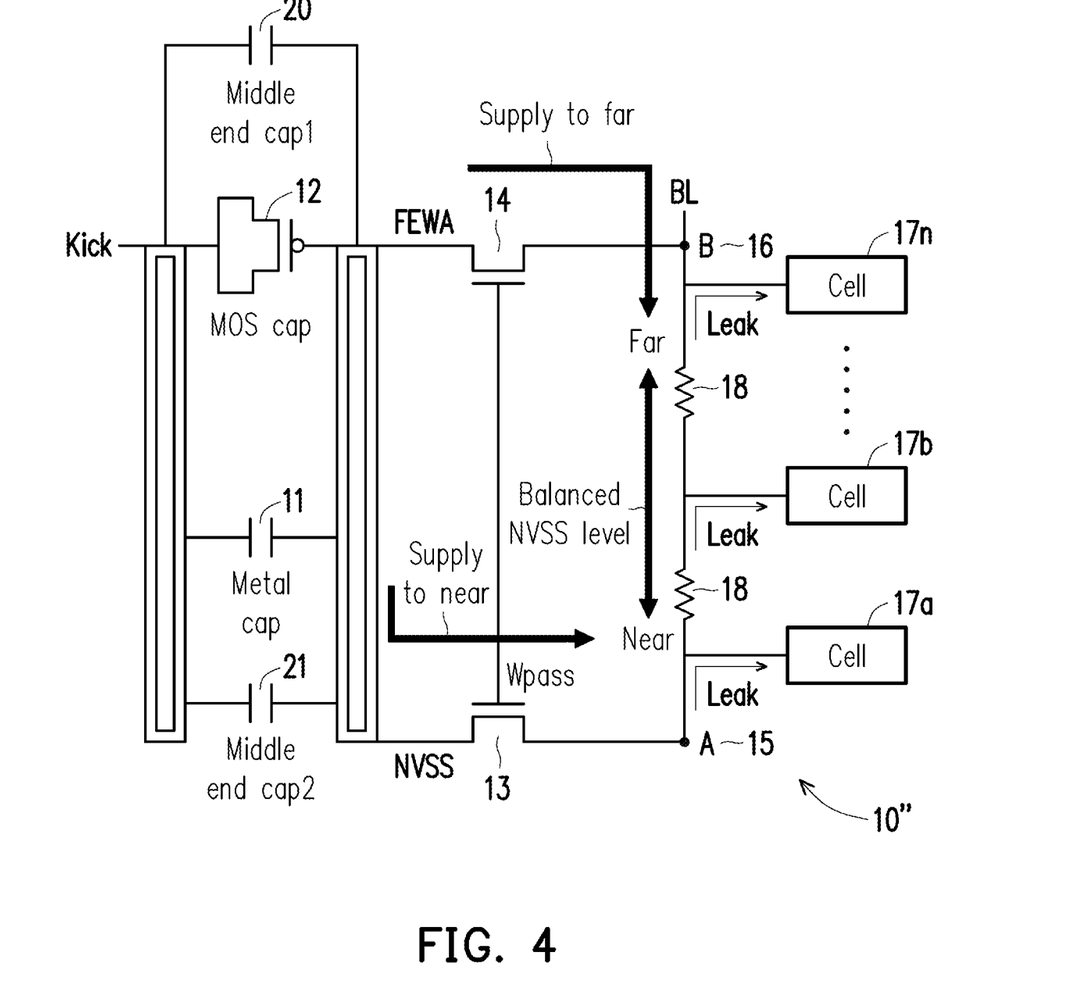
FIG. 4 is a schematic diagram illustrating aspects of a second alternative embodiment balanced negative bitline voltage circuit in accordance with some embodiments.

Referring to FIG. 4, a second alternative balanced negative bitline voltage circuit 10" is illustrated in accordance with some embodiments. In this embodiment, in addition to the MOS capacitor 12 and the metal capacitor 11, a first middle end capacitor 20 and second middle end capacitor 21 are added in parallel. As noted above in connection with FIG. 3, the MOS capacitor 12 location is also shown as described in that alternative.

In some embodiments, middle end capacitors from a poly on diffusion edge ("PODE") gate may be used to form additional coupling capacitance. This may reduce the real estate penalty of the MOS capacitor and/or the metal capacitor. In addition, in a finfet 3D structure, use of a metal layer (such as a metal 0 layer M0) oxide diffusion (MOOD) or active region provides the opportunity to utilize a larger coupling capacitor that may exist between the MOOD and the polysilicon regions (e.g., also referred to as "poly"). Still further, there is often an abundance of usable dummy poly and in some cases it may be possible to totally replace the MOS capacitor.

PODE structures may be formed on the edges of a standard cell and are used to protect the ends of the semiconductor fins during processing. That is, the PODE polysilicon structures are not electrically connected as gates for MOS devices but are instead "dummy" structures, having no function in the circuit. The PODE structures cover and protect the ends of the fins in the cells, providing additional reliability during processing.

Figure 7:
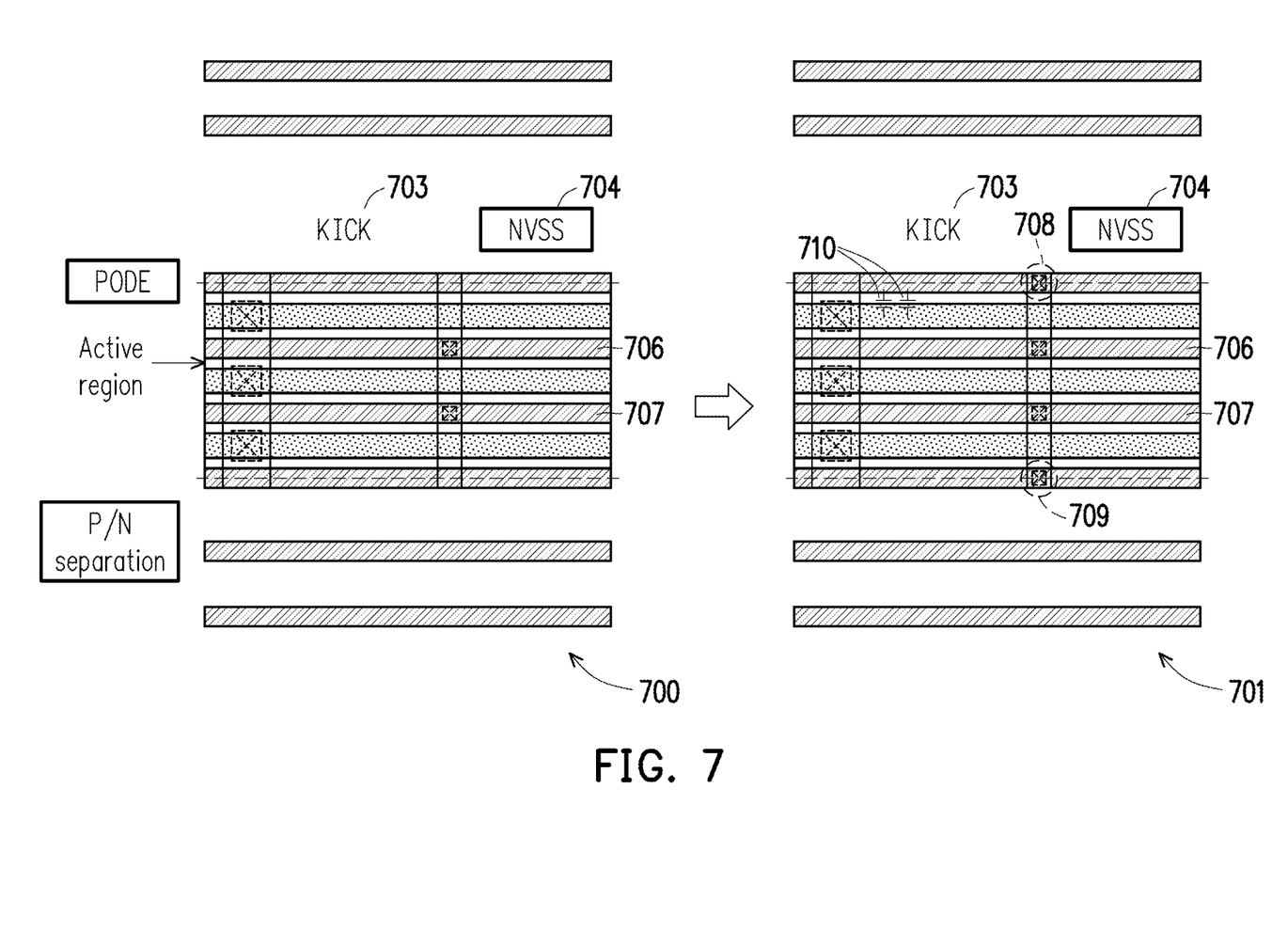
FIG. 7 is a schematic diagram illustrating the formation of a representative middle end capacitor in accordance with some embodiments.

A representative example of creating a capacitor from a PODE layer is generally illustrated in FIG. 7. The beginning structure is illustrated at 700 and the modified structure including a capacitor is shown at 701. The Kick voltage is shown at designation 703 and the NVSS voltage is shown at the designation 704. The beginning structure 700 forms a two finger MOS with the first finger at 706 and the second finger at 707. By including the via at designation 708 and 709 (i.e., as shown in the modified structure 700), middle end capacitors 710 may be formed in the empty middle end layer 707.

Figure 5:
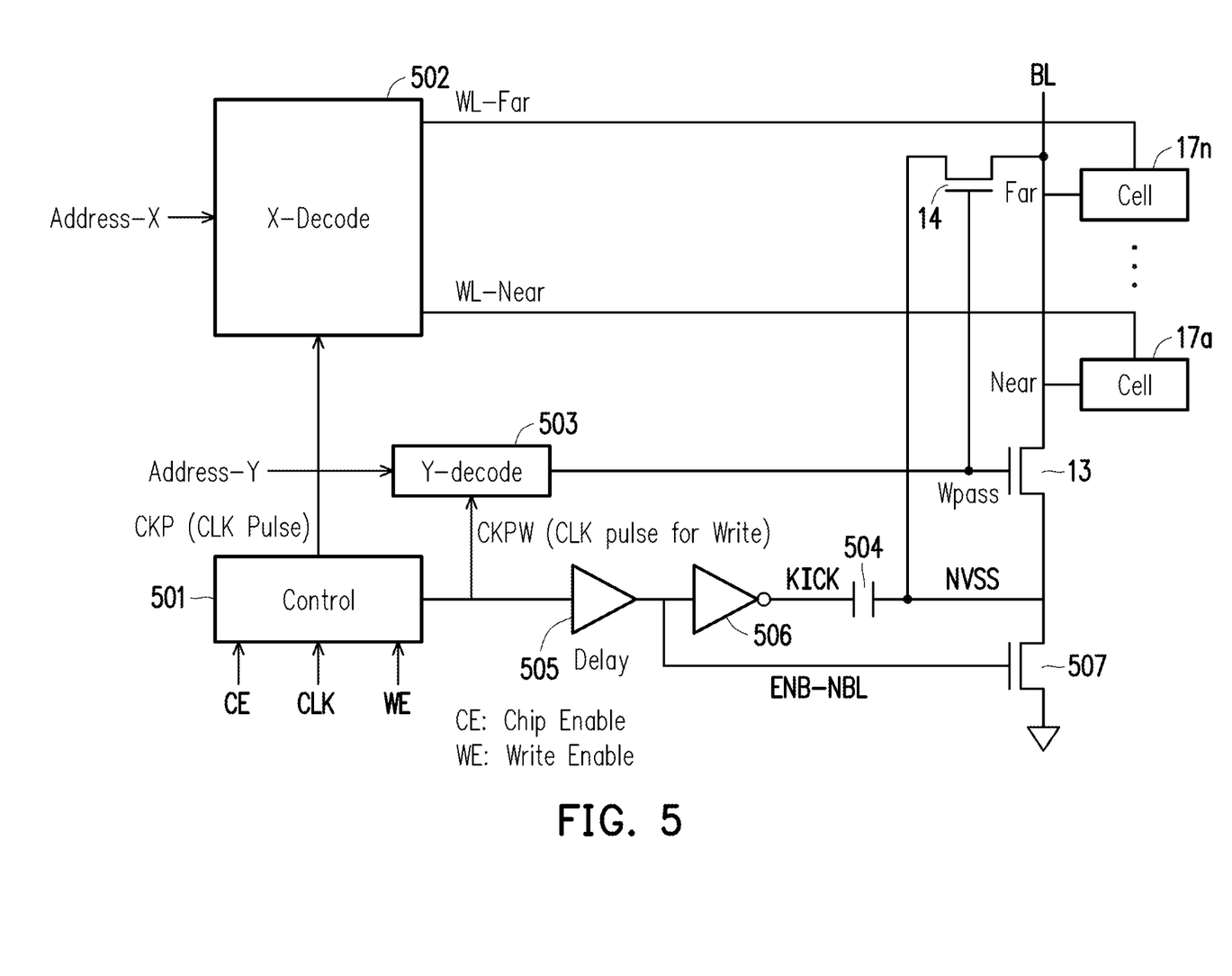
FIG. 5 is a functional block diagram illustrating a write assist circuit in which a balanced negative bitline voltage circuit of FIG. 1 is employed in accordance with some embodiments.

FIG. 5 illustrates the functional blocks which may be used in connection with implementing a balanced negative bitline voltage in some embodiments. Control block 501 includes a chip enable input (CE), a clock input (CLK), and a write enable input (WE). A clock pulse output from the control block is provided to X-Decode block 502 to provide circuit timing. The X-Decode block 502 receives the X address (Address-X) information and decodes the information to provide word line signals to the appropriate memory cells 17a-17n, corresponding to word-line far (WL-Far) through word-line near (WL-Near) respectively.

Y-decode block 503 receives the Y address (Address-Y) information and decodes the information to enable the Wpass signal to first NMOS transistor 13 and second NMOS transistor 14. Control block 501 provides clock pulse for WRITE timing to Y-decode block. Control block 501 further provides the signal initiating the negative bitline enable, which is applied to the gate of NMOS 507. Subsequently the Kick is initiated after propagating through appropriate delay and inverter blocks 505 and 506. The falling edge of the Kick signal is coupled to capacitor 504 where the negative bias signal is generated (NVSS). The negative bias signal is provided to both the near and far-ends of the bitline in a more balanced manner.

The capacitor 504 in FIG. 5 is representative of the total capacitance of the various capacitors described above (e.g., a metal capacitor, a MOS capacitor and/or a PODE capacitor)—and may be constructed of any combination of the same providing that FEWA is achieved. The desired size or capacitance of capacitor 504 may be determined based on the bitline capacitance, the required SRAM bitline write voltage, and the coupling efficiency among other factors.

Figure 6A:
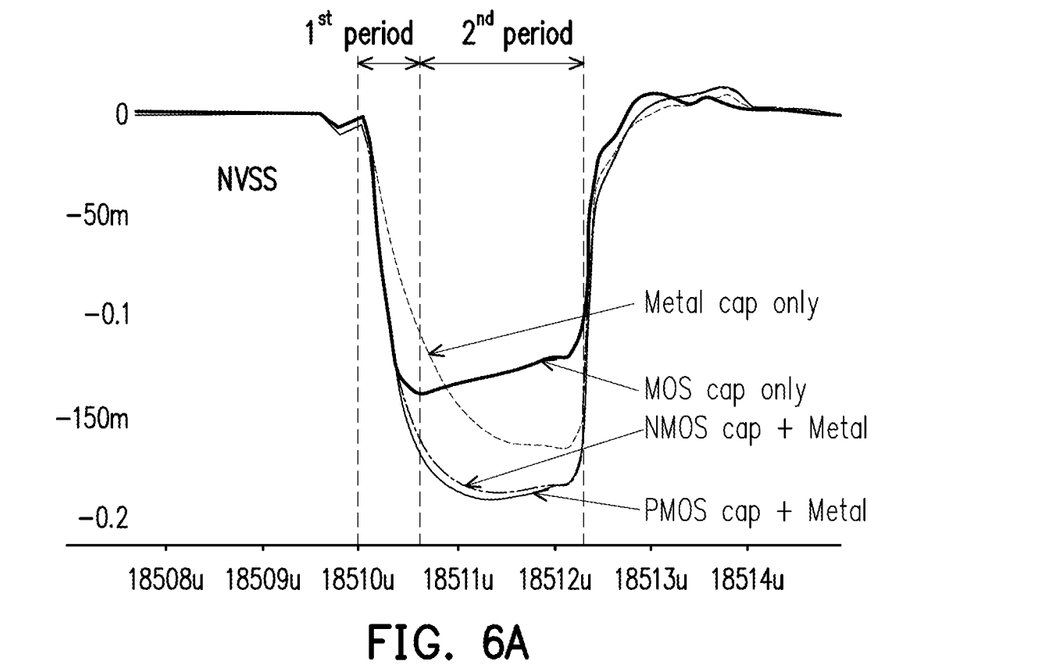
FIG. 6A illustrates a response of a MOS Capacitor compared to a metal capacitor response at the near-end of a bitline in accordance with some embodiments.
Figure 6B:
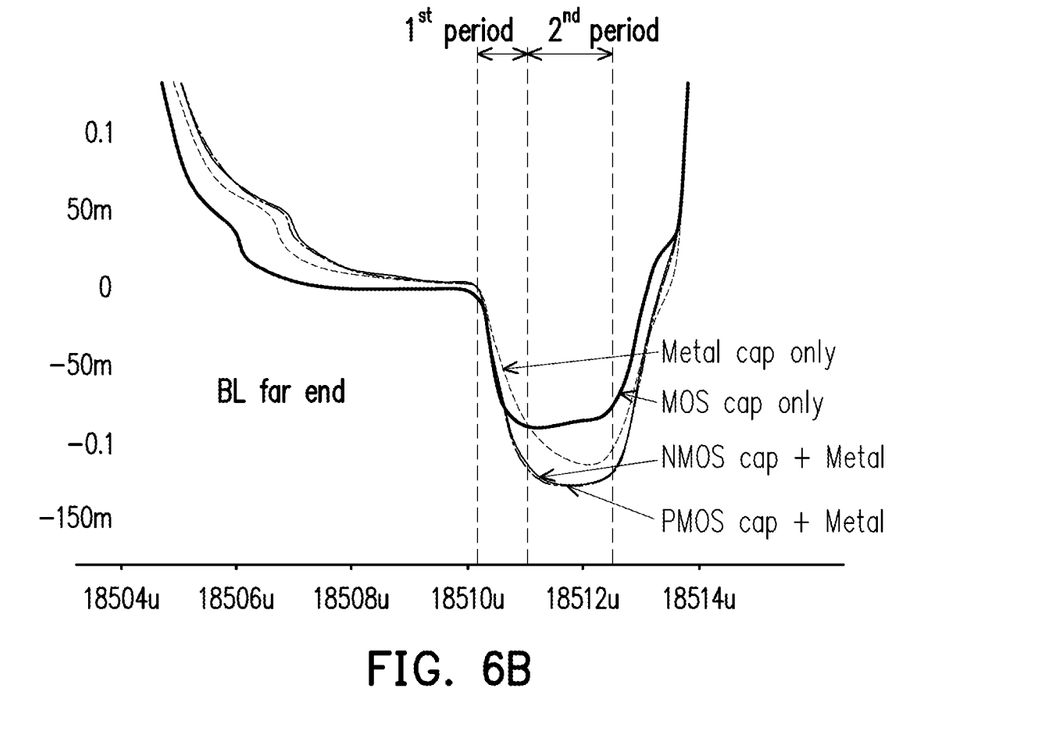
FIG. 6B illustrates a response of a MOS Capacitor compared to a metal capacitor response at the far-end of a bitline in accordance with some embodiments.

FIGS. 6A and 6B illustrate that using a MOS capacitor and a metal capacitor together may be useful. Referring first to FIG. 6A, at the near-end the MOS capacitor provides a greater negative voltage during a first period compared to the metal capacitor. However, the RC time constant for the MOS capacitor is shorter than the metal capacitor. Accordingly, the metal capacitor holds the charge longer and at a deeper negative voltage. When the two capacitors are used together, the result is a greater negative voltage over both the first and second periods than either of the capacitors used alone. Further, either an NMOS or PMOS capacitor may be used and exhibit similar results. FIG. 6B illustrates the voltages over time at the far-end. The results for the far-end are similar to those at the near-end. Accordingly, the combination of a MOS capacitor used together with a metal capacitor provide a greater negative voltage over a longer period.

While not explicitly shown, cells 17a-17n form a memory array which may be comprised of one or more SRAM devices. Each SRAM device may be formed as a six-transistor SRAM memory cell. However, other SRAM memory cell arrangements could be employed in other embodiments. Further, while the Figures illustrate a single bitline, it will be appreciated that the invention may be used in connection with each bitline in a memory array or a subset of the bitlines.

Figure 8:
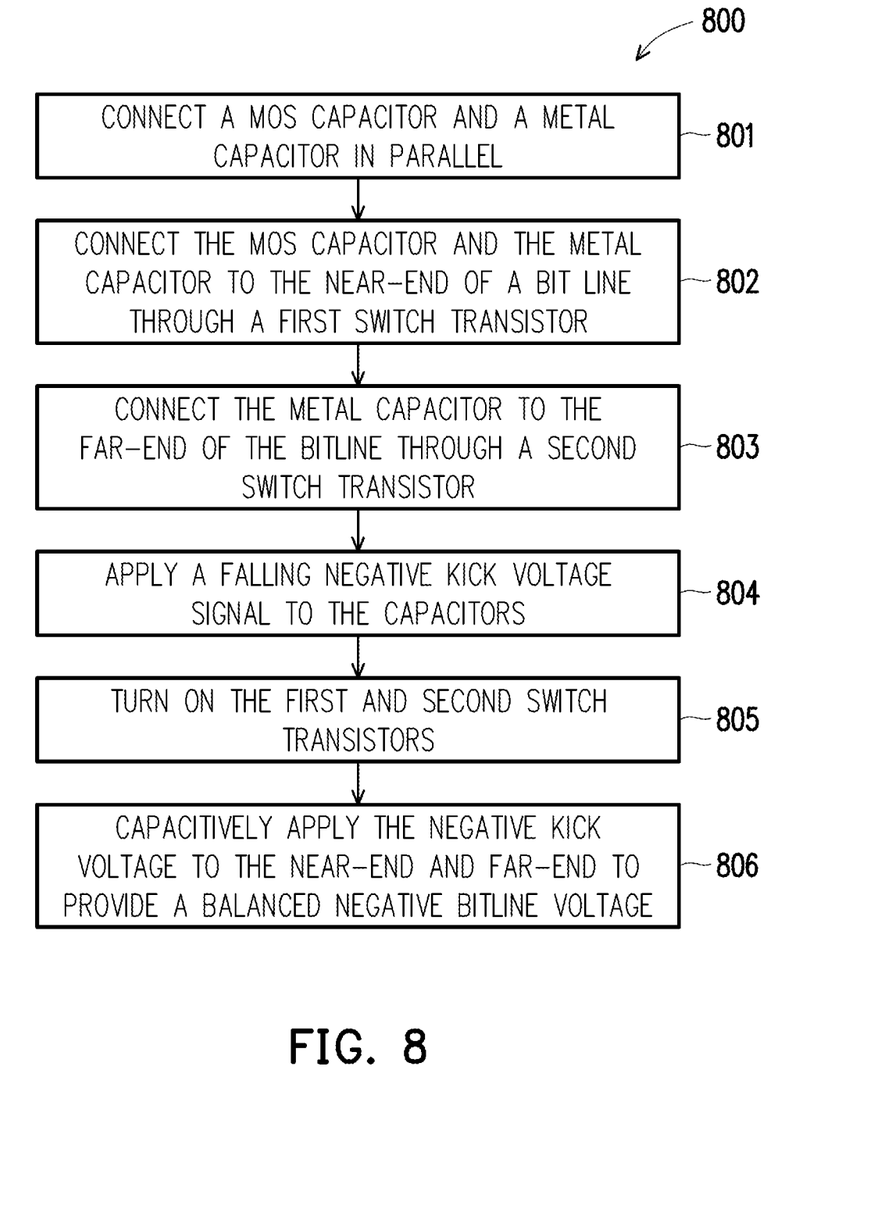
FIG. 8 is a representative block diagram of a method which may be employed to create a balanced negative bitline voltage in a write assist circuit in accordance with some embodiments.

Referring to FIG. 8, a method for establishing a balanced negative bitline voltage for a write assist circuit in accordance with some embodiments is disclosed generally at 800. First, at block 801 a MOS capacitor and a metal capacitor, such as the capacitors 12 and 11, respectively, of FIG. 1, are connected in parallel. At block 802 the second plate of the two capacitors are connected to a near-end of a bitline through a first switch transistor 13. At block 803 the second plate of the metal capacitor is connected to the far-end of the bit line through a second switch transistor 14. At block 804 a falling negative Kick voltage is applied to the first plates of the MOS and metal capacitors. In some embodiments the falling voltage begins at zero volts and falls to minus 200 mV. However, other beginning and ending voltages may be employed in other embodiments.

At block 805, the first and second switch transistors are turned on by a Wpass signal (i.e., when the Y-address decode module selects the bitline). The transistors being in a low resistance state creates a coupling between the Kick voltage signal and NVSS via the metal capacitor and the MOS capacitor. The capacitors operate by trying to maintain the voltage differential and so drive NVSS low. At block 806, the negative bitline voltage is applied to both the near and far end of the bitline in a balanced manner, thereby increasing the accuracy of the WRITE function of the memory cells.

The method may be utilized, for example, in connection with one or more bitlines in a memory array. In particular, write assist circuits may employ the balanced negative bitline to increase WRITE accuracy while limiting the need to overdrive the negative voltage level at the near-end. Memory arrays and other circuits operating in low voltage domains may employ these techniques, including a memory array of SRAM devices.

Disclosed embodiments include a write assist circuit, where the circuit is attached to a bit line having a near-end and a far-end. First and second switch transistors are connected to the near-end and far-end, respectively and the first and second switch transistors are responsive to a write enable signal. A first capacitor and a second capacitor are connected in parallel. The first capacitor is connected to at least one of the first switch transistor and the second switch transistor. The second capacitor is connected to both the first and second switch transistors. In this manner, the capacitors maintain a balanced negative voltage to the near-end and far-end for a period of time while the write enable signal turns on the first and second switch transistors.

In accordance with further disclosed embodiments, a device is disclosed comprising: a first transistor switch connected to a near-end of a bitline and a second transistor switch connected to a far-end of a bitline. The first and second transistor switches are responsive to a pass signal. A MOS capacitor and a metal capacitor are connected in parallel, with the MOS capacitor being connected directly to at least one of the first transistor switch and the second transistor switch. The metal capacitor is directly connected to both the first and second transistor switches. A control circuit provides a kick signal during a write operation. The kick signal falls from a ground level to a negative level.

Application of the kick signal to the MOS capacitor and the metal capacitor creates a balanced coupling between the kick signal voltage and the voltages at the near-end and the far-end. The coupling lasts during the time that the pass signal is applied to the first and second switch transistors.

In accordance with still further disclosed embodiments a method for establishing a balanced negative voltage to a near-end and far-end of a bitline is disclosed. The method includes connecting a MOS capacitor and a metal capacitor in parallel, with the second plate of the MOS capacitor connected to a near-end of a bitline through a first switch transistor. The second plate of the metal capacitor is connected to the near-end of the bitline through the first switch transistor and a far end of the bitline through a second switch transistor. A falling negative kick voltage is applied to the first plates of the MOS capacitor and the metal capacitor. The switch transistors are turned on wherein the MOS capacitor and the metal capacitor are coupled to the voltage at both the near-end and far-end. This provides a balanced voltage to the bitline approximately equal to the kick voltage for a period of time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A write assist circuit, comprising:
   a bit line having a near-end and a far-end;
   first and second switch transistors connected to the near-end and far-end, respectively, and where the first and second switch transistors are responsive to a write enable signal; and
   a first capacitor and a second capacitor connected in parallel, where the first capacitor is connected to at least one of the first switch transistor and the second switch transistor and the second capacitor is connected to both the first and second switch transistors, wherein the first and second capacitors maintain a balanced negative voltage to the near-end and far-end for a period of time during the write enable signal turning on the first and second switch transistors.

2. The write assist circuit of claim 1, wherein a falling negative voltage boost signal is applied to the first capacitor and the second capacitor to establish a level of the balanced negative voltage.

3. The write assist circuit of claim 1, wherein the first capacitor is a MOS capacitor.

4. The write assist circuit of claim 1, wherein the second capacitor is a metal capacitor.

5. The write assist circuit of claim 1, wherein the first capacitor is an MOS capacitor and the second capacitor is a metal capacitor.

6. The write assist circuit of claim 5, wherein the boost signal is applied to a first plate of the first and second capacitors and a second plate of the capacitors is connected to the first and second switch transistors.

7. The write assist circuit of claim 6, wherein the boost signal falls to a voltage in the range of 0 mV to minus 300 mV.

8. The write assist circuit of claim 6, wherein the boost signal falls from 0 mV to approximately minus 200 mV.

9. The write assist circuit of claim 1, further comprising at least one of the first capacitor or second capacitor is formed from a PODE middle end portion of a MOS transistor.

10. A device comprising:
    a first transistor switch connected to a near-end of a bitline and a second transistor switch connected to a far-end of a bitline, the first and second transistor switches responsive to a pass signal;
    a MOS capacitor and a metal capacitor connected in parallel, the MOS capacitor connected directly to at least one of the first transistor switch and the second transistor switch and the metal capacitor being directly connected to both the first and second transistor switches; and
    a control circuit, the control circuit providing a kick signal during a write operation, the kick signal falling from a ground level to a negative level, wherein application of the kick signal to the MOS capacitor and the metal capacitor creates a balanced coupling between the kick signal voltage and the voltage at the near-end and the far-end during the time that the pass signal is applied to the first and second switch transistors.

11. The device of claim 10, wherein the pass signal is generated by a y-address decode module.

12. The device of claim 10, wherein the kick voltage is applied to the first plate of the MOS capacitor and the first plate of the metal capacitor.

13. The device of claim 12, wherein the kick voltage is delayed and inverted subsequent to being generated by the control module.

14. The device of claim 10, wherein the second plate of the MOS capacitor and the second plate of the metal capacitor are connected to the first and second switch transistors.

15. The device of claim 10, wherein the boost signal falls from 0 mV to approximately minus 200 mV when applied to the MOS capacitor and the metal capacitor.

16. The device of claim 10, further comprising a plurality of SRAM memory cells connected to the bitline between the near-end and far-end.

17. The device of claim 16, further comprising a plurality of near-end and far-end bitlines and a plurality of devices, each device corresponding to a respective bitline.

18. A method of establishing a balanced negative voltage to a near-end and far-end of a bitline, comprising:
    connecting a MOS capacitor and a metal capacitor in parallel, with a second plate of the MOS capacitor connected to a near-end of a bitline through a first switch transistor and a second plate of the metal capacitor connected to the near-end of the bitline through the first switch transistor and a far end of the bitline through a second switch transistor;
    applying a falling negative kick voltage to the first plates of the MOS capacitor and the metal capacitor; and
    turning on the first and second switch transistors, wherein the MOS capacitor and the metal capacitor are coupled to the voltage at the near-end and far-end and provide a balanced voltage to the bitline approximately equal to the kick voltage for a period of time.

19. The method of claim 18, further comprising turning on the first and second switch transistors in response to a y-address decode module signal in a SRAM array of memory cells.

20. The method of claim 18, wherein the balanced voltage is between minus 100 mV and minus 200 mV.

\* \* \* \* \*